United States Patent [19]
Shimizu et al.

[11] 3,939,428
[45] Feb. 17, 1976

[54] RECEIVER WITH AUTOMATIC PASS BAND CONTROL

[75] Inventors: Ikuo Shimizu, Tokyo; Keiko Ichihara, Ichikawa, both of Japan

[73] Assignee: Sony Corporation, Tokyo, Japan

[22] Filed: Nov. 26, 1974

[21] Appl. No.: 527,483

[30] Foreign Application Priority Data
Nov. 30, 1973 Japan............................ 48-135131

[52] U.S. Cl................................. 325/427; 325/490
[51] Int. Cl.².......................................... H04B 1/16
[58] Field of Search.................... 325/427, 489, 490

[56] References Cited
UNITED STATES PATENTS

| | | | |
|---|---|---|---|
| 3,231,822 | 1/1966 | Tillotson | 325/427 |
| 3,281,698 | 10/1966 | Rose | 325/427 |
| 3,551,857 | 12/1970 | Langer | 325/427 |

*Primary Examiner*—Albert J. Mayer
*Attorney, Agent, or Firm*—Lewis H. Eslinger; Alvin Sinderbrand

[57] ABSTRACT

A receiver having a circuit producing a control signal that has an amplitude proportional to the intensity of an input signal, and a control circuit permitting the passage of high frequency components of a low frequency signal therethrough or preventing the passage thereof, as determined by the control signal. The receiver further includes a control circuit that permits passage of low frequency components of the low frequency signal or prevents passage thereof, as determined by the control signal.

6 Claims, 4 Drawing Figures

RECEIVER WITH AUTOMATIC PASS BAND CONTROL

BACKGROUND OF THE INVENTION

1. Field of the Invention

The present invention relates generally to a receiver, and more particularly is directed to a receiver that includes a circuit to control the pass band of a demodulated signal.

2. Description of the Prior Art

In prior art radio receivers when the electric field intensity of a received broadcasting wave is low, noise components of relatively high frequency are included in sound reproduced from the speaker. As a result, the reproduced sound is less intelligible or is less pleasant to listen to or both. This is caused by the fact that an intermediate frequency amplifier stage or low frequency amplifier stage has a fixed pass band.

It has already been proposed to control the pass band of the intermediate frequency signal stage in response to the electric field intensity of the desired signal. The intermediate frequency stage was designed to have a pass band of a certain width in response to a strong signal but to have a narrower pass band in response to a weak signal. Accordingly, noise contained in the high frequency band components of the demodulated signal was partially eliminated when a weak signal was being received, but the improvement in the signal-to-noise (S/N) ratio was not good enough.

SUMMARY OF THE INVENTION

A receiver according to the present invention has a frequency characteristic control circuit in its audio channel. The signal strength of the received signal is measured at the detector circuit that also rectifies the signal, and the rectified signal is connected to the control circuit to control the frequency response of the audio channel.

Accordingly, it is an object of the present invention to provide a receiver in which, when the signal strength of a received broadcasting wave is low, the high frequency band components of the detected audio signal are attenuated to provide reproduced sound with less noise components in it.

It is a further object of the present invention to provide a receiver in which a frequency characteristic control circuit connected to an audio stage is controlled to remove the low and high frequency band components of an audio frequency signal obtained by rectifying a weak incoming signal and to reproduce the audio signal with good S/N ratio.

It is a still further object of the present invention to provide a receiver in which a frequency characteristic control circuit connected to an audio stage and a variable filter circuit connected to an IF stage are both controlled at the same time in response to the signal strength of the incoming signal to reproduce an audio signal with high S/N ratio.

It is a still further object of the present invention to provide a receiver with the aforementioned characteristics but requiring only a smaller number of parts and, therefore, capable of being produced at low cost.

Other objects, features and advantages of the present invention will become apparent from the following description taken in conjunction with the accompanying drawings.

DESCRIPTION OF THE PREFERRED EMBODIMENTS

Figure 1:
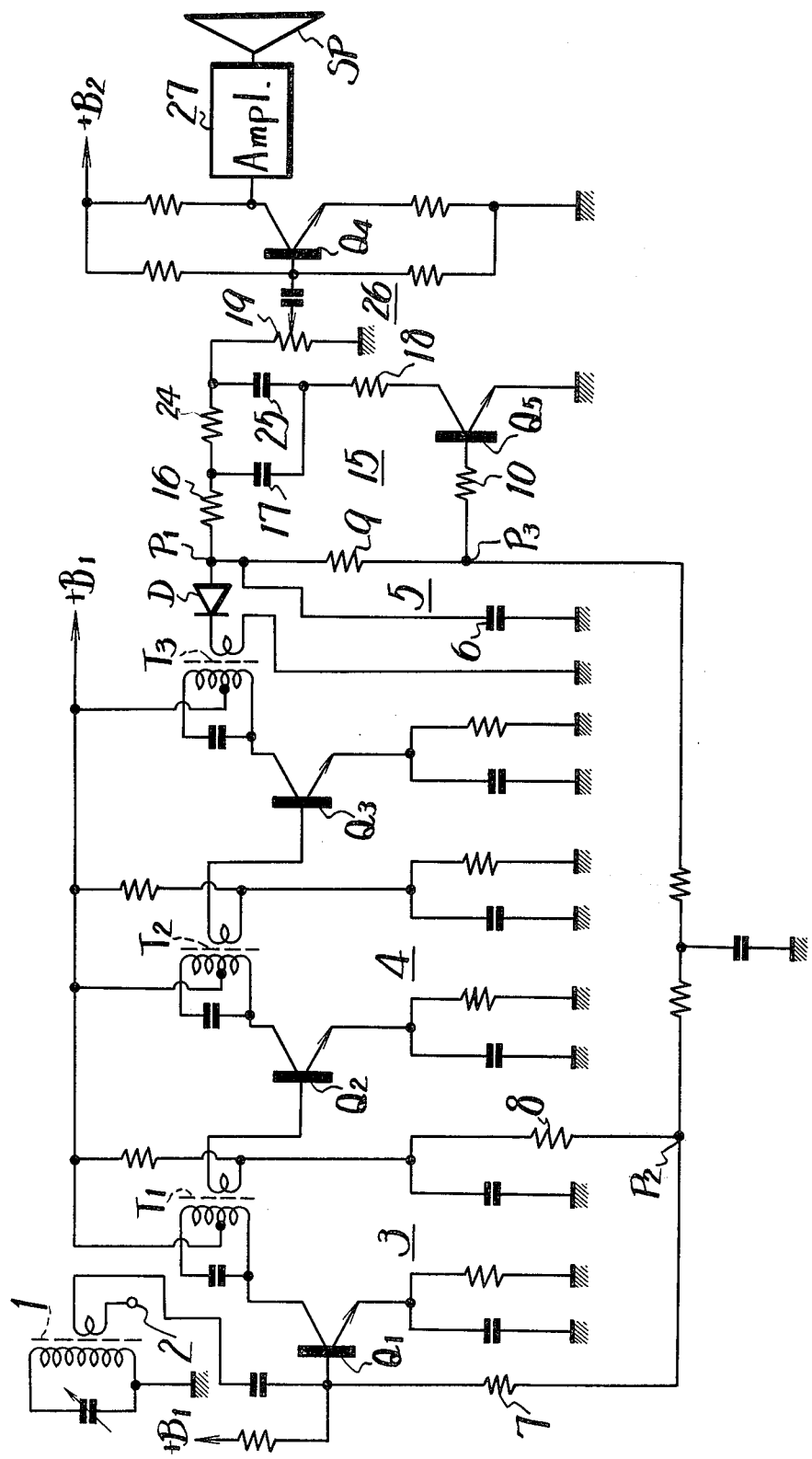
FIG. 1 is a circuit diagram showing an embodiment of the receiver according to the present invention.

FIG. 1 shows the embodiment in which the present invention is applied to an AM radio receiver. The circuit includes, in the usual order along a signal path: an antenna coil 1, an input terminal 2 to which a heterodyne signal from a local oscillator (not shown) is applied, a mixer 3, an intermediate frequency signal amplifier stage 4 that includes a circuit resonant to an intermediate frequency signal, a detector circuit 5, a volume control resistor 19, a pre-amplifier circuit 26, an output signal amplifier circuit 27, and a speaker SP. The mixer 3 includes a transistor $Q_1$. The transistors $Q_2$ and $Q_3$ are connected in successive stages of the intermediate frequency amplifier circuit 4, and tuned transformers $T_1 - T_3$ are used as coupling circuits between the stages of the mixer 3 and the intermediate frequency signal amplifier circuit 4.

The detector circuit 5 includes a diode D for detection and a capacitor 6 for smoothing. The cathode of the diode D is connected to one end of the secondary winding of the transformer $T_3$, and the primary winding of this transformer is connected to the output circuit of the transistor $Q_3$. The other end of the secondary winding of the transformer $T_3$ is grounded. The capacitor 6 is connected between the anode of the diode D and ground. A circuit point $P_1$ is connected to the anode of the diode D. This point $P_1$ is also connected through a series circuit comprising a resistor 9 and a resistor 7, to the base of the transistor $Q_1$ in the mixer 3 and, through an additional resistor 8 and the secondary winding of the transformer $T_1$, to the base of the transistor $Q_2$ to form an automatic gain control (AGC) circuit. A connection point $P_2$ is located between the resistors 7 and 8. A voltage source $+B_1$ is provided for the mixer 3 and the intermediate frequency signal amplifier circuit 4, and another voltage source $+B_2$ is provided for the output signal amplifier circuit 26.

The receiver also includes a frequency characteristic control circuit 15, which is a variable filter and is formed of resistors 10, 16, 18, 24, capacitors 17, 25, and a transistor $Q_5$. The diode D is connected through the series-connected resistors 16 and 24 to one end of the volume control 19, the other end of which is grounded. The resistors 16 and 24 and the caapacitors 17 and 25 form a low pass filter circuit as part of the control circuit 15. The capacitors 17 and 25 are connected together to ground through a series circuit that includes the resistor 18 and the emitter-collector path of the transistor $Q_5$. A circuit point $P_3$ between the resistors 9 and 10, is connected to the point $P_2$ through resistors and is connected to the base of the transistor $Q_5$ through the resistor 10.

The operation of the receiver shown in FIG. 1 will be now described. The detector 5 serves to detect the level of a high frequency input signal applied to the antenna coil 1 and processed through the transistors $Q_1 - Q_3$.

The detected output from the detector circuit 5 is applied to the base of the transistor $Q_5$. When the signal strength of the received broadcasting wave is sufficiently great, the detector circuit 5 produces a negative detected output signal that causes the transistor to be non-conductive, so that the output from the detector circuit 5 can be supplied through the resistors 16 and 24 to the volume control 19.

On the other hand, when the strength of the received broadcasting signal is low, the output signal from the detector 5 has a low amplitude. The bias voltage applied at the base of the transistor $Q_1$ is also connected to the base of the transistor $Q_5$ and causes the base voltage of the transistor $Q_5$ to be positive. This makes the latter transistor conductive. As a result, the frequency characteristic control circuit 15 operates as a low pass filter with the result that the amplitude of the high frequency components of the output signal from the detector circuit 5 is reduced.

Figure 2:
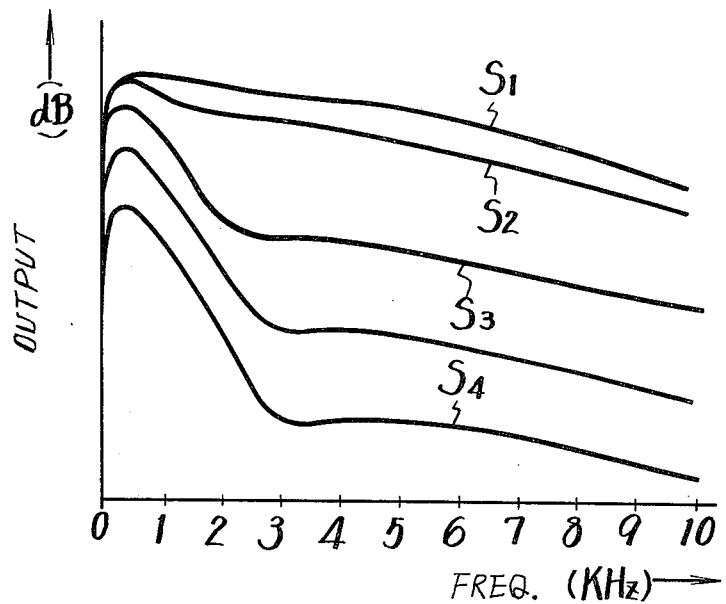
FIG. 2 is a graph illustrating certain operating characteristics of the receiver shown in FIG. 1.

FIG. 2 is a graph showing the measured result when the level of the audio signal applied to the speaker SP is varied as a result of variations in the signal strength of the received broadcasting signal. In the graph the abscissa is calibrated in KHz according to the frequency of the audio signal, and the ordinate is calibrated in dB according to the output level of the audio signal applied to the speaker SP. Curves $S_1$, $S_2$, $S_3$, and $S_4$ show the frequency characteristics of the audio signal when the signal strength is 75dB/m, 65dB/m 45dB/m, and 35dB/m, respectively. The resistance values of the resistors 16 and 24 in the frequency characteristic control circuit 15 are 10K $\Omega$ and 1.6K$\Omega$, the capacity values of the capacitors 17 and 25 are 0.015 $\mu$F and 0.056 $\mu$F, and the input impedance of the speaker SP is 8 $\Omega$, respectively.

As may be apparent from the graph of FIG. 2, when the signal strength of the received broadcasting wave is less than 65dB/m, the high frequency band of the audio signal is attenuated more than frequencies lower than about 1KHz.

In the receiver shown in FIG. 1, when the signal strength of the received broadcasting wave is low, only the high frequency components of the audio signal are lowered. In comparison, the lower frequency components are emphasized exaggeratedly and hence the clarity of the sound from the speaker SP is deteriorated.

Figure 3:
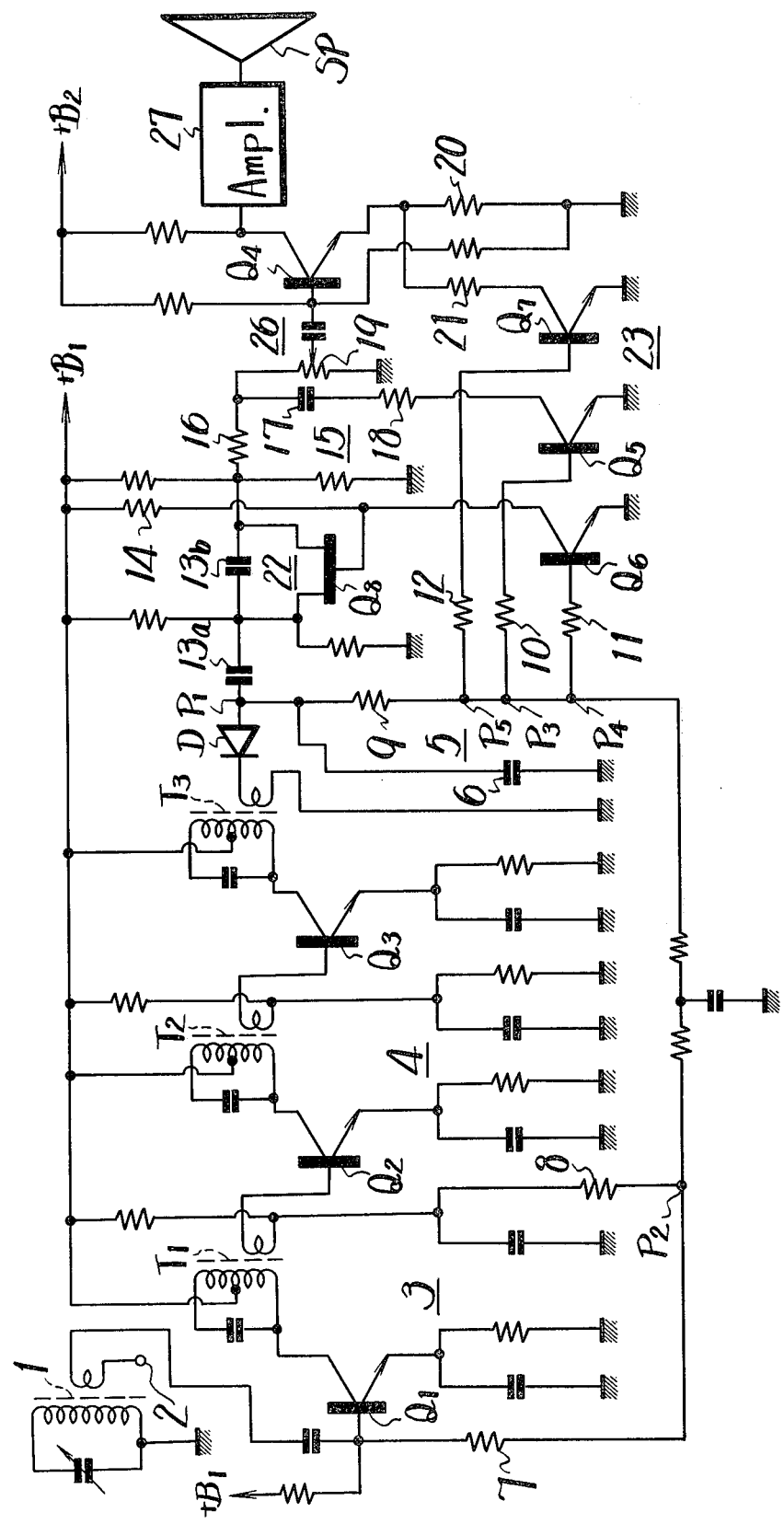
FIG. 3 is a circuit diagram showing another embodiment of the receiver of the present invention.

A receiver shown in FIG. 3 avoids the latter defect. In FIG. 3, the elements that are the same as those used in FIG. 1 are identified by the same reference numerals and symbols, and their description will be omitted. With the receiver shown in FIG. 3, when the signal strength of the received broadcasting wave is low, the high frequency components higher than, for example, 1KHz are attenuated as described previously in connection with FIG. 1. However, the low frequency components lower than, for example, 300—400Hz are also attenuated. Since the level of the audio signal is reduced, as a whole, due to the attenuation of both the high and low frequency components, the gain of the pre-amplifier 26 is increased when the signal strength of the received broadcasting wave is low as compared with the gain when the signal strength of the received broadcasting wave is high.

The frequency characteristic control circuit 15 is similar to that in FIG. 1, but it includes only the resistor 16, the capacitor 17, the resistor 18, the transistor $Q_5$ and the resistor 10.

The embodiment of FIG. 3 also includes a second frequency characteristic control circuit 22 which is formed of a capacitor 13a, a field effect transistor (FET) $Q_8$, a resistor 14, a transistor $Q_6$, and a resistor 11. The anode of the diode D is connected through the capacitor 13a to the source of the FET $Q_8$ which is connected through a capacitor 13b to the drain of the same FET. The drain of the FET $Q_8$ is connected through the resistor 16 to one end of the volume control 19. The voltage source +$B_1$ is connected through the resistor 14 to the gate of the FET $Q_8$. The collector-emitter path of the transistor $Q_6$ is connected in series between the gate of the FET and ground. A point $P_4$ connected directly to the point $P_3$ is also connected through the resistor 11 to the base of the transistor $Q_6$. In this case, a bias circuit is provided for connecting the source and drain of the FET $Q_8$ to the same DC potential to avoid any adverse effect that the control signal applied to the gate of the FET $Q_8$ may exert on the audio signal.

A gain control circuit 23 is connected to the pre-amplifier 26. The gain control circuit is formed so that the emitter of the amplifying transistor $Q_4$ is grounded through a resistor 20 and is also grounded through a series circuit that includes a resistor 21 and the emitter-collector path of a transistor $Q_7$. The base of the latter is connected by a resistor 12 to a point $P_5$ that is short-circuited to the points $P_3$ and $P_4$.

The operation of the receiver shown in FIG. 3 will be now described. When the signal strength of the received broadcasting wave is sufficiently high, the detected negative, output signal from the detector circuit 5 is great enough to bias all of the transistors $Q_5$, $Q_6$, and $Q_7$ to be non-conductive. Hence the audio signal from the detector circuit 5 is applied to the pre-amplifier 26 with a substantially flat frequency response characteristic. The gain of the pre-amplifier 26 is maintained at a predetermined value.

When the signal strength of the received broadcasting wave becomes lower than a certain value, the negative detected output signal from the detector circuit 5 also becomes small. However, the base voltages of the transistors $Q_5$, $Q_6$, $Q_7$ are made positive by the base voltage of the transistor $Q_1$ and hence all the transistors $Q_5$, $Q_6$, and $Q_7$ become conductive. As a result, in the first frequency characteristic control circuit 15, the high frequency components of the detected audio signal from the detector circuit 5 are attenuated, and in the second frequency characteristic control circuit 22, the FET $Q_8$ is made conductive to short-circuit the capacitor 13b. This attenuates the low frequency components of the audio signal. At the same time, the gain of the pre-amplifier 26 is increased. As a result, both the low and high frequency components of sound reproduced from the speaker SP are attenuated.

According to the present invention described as above, the frequency characteristic control circuit is provided in the audio signal system and the detector circuit is provided which detects the level of the received signal and variably controls the frequency characteristic of the frequency characteristic control circuit. Thus, when the level of the received signal becomes low, the frequency characteristic of the frequency characteristic control circuit is varied to attenuate at least high frequency components of the audio signal demodulated from the received signal. Therefore, even in the case where the signal strength of the received broadcasting wave is small, high frequency noise is not so conspicuous and accordingly the reproduced sound is more intelligible. Further, since the noise is eliminated during the time interval when the tuning is not completed, the discomfort due to harsh sounds while tuning from one station to another are avoided.

If the second frequency characteristic control circuit is provided as shown in the embodiment of FIG. 3 for attenuating the low frequency band components of the audio signal when the level of the high frequency input signal is low, the clarity of the reproduced sound is improved.

Further, if the gain of the amplifier circuit for amplifying the audio signal is increased when the level of the high frequency input signal drops, as shown in FIG. 3, the reproduced sound is not attenuated as compared with the case where the level of the high frequency input signal is high.

Figure 4:
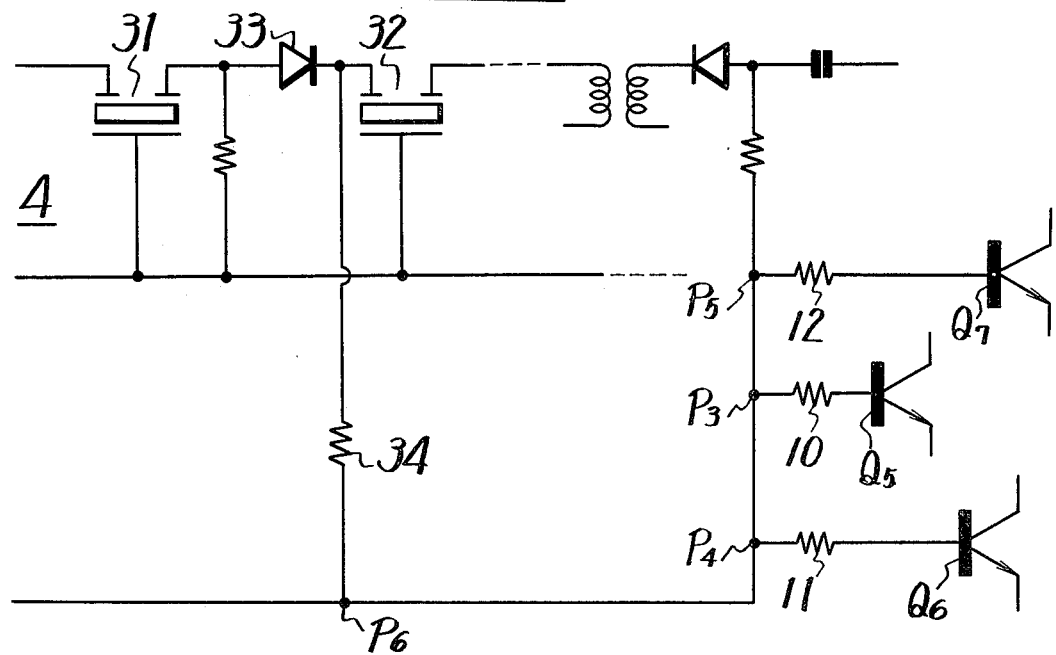
FIG. 4 is a circuit diagram showing a part of a further embodiment of the receiver of the present invention.

FIG. 4 shows the main part of a further embodiment of the present invention. In the embodiment of FIG. 4, the intermediate frequency signal amplifier circuit includes two ceramic filters 31 and 32 and a variable capacitor 33 connected therebetween. The cathode of the variable capacitor 33 is connected through a resistor 34 to the detector circuit 5 and, specifically, to a point $P_6$ of the AGC loop. In this case, the transistors $Q_5$, $Q_6$, and $Q_7$ are controlled in response to the signal strength of the received signal, as in the above embodiments, to vary the audio band. At the same time, the capacitance of the variable capacitor 33 is varied, so that the pass band of the IF signal is also varied. For example, the pass band of the intermediate frequency signal amplifier circuit becomes narrow when the signal strength is low, thus eliminating jamming waves and noises.

With any of the above embodiments of the present invention, the control signal which varies the band is obtained from the audio detector circuit, but it may be possible to provide the control signal by separately rectifying the intermediate frequency signal.

Further, in place of the variable capacitor 33 in FIG. 4, another variable capacitance element or a passive circuit including a switching circuit can be used with the same effect.

It may be apparent that many modifications and variations could be effected by one skilled in the art without departing from the true scope of the present invention.

What is claimed is:

1. In a receiver for modulated information signals the combination for attenuating higher frequency noise as a function of reduced signal strength comprising:
   a detector circuit for demodulating received signals, the output of said detector circuit representing said information and being indicative of the strength of said received signals;
   amplifying means for amplifying said detector circuit output to thereby recover said information;
   circuit means coupled to said detector circuit and responsive to said detector circuit output indicative of said received signal strength for producing a control signal which is a function of said received signal strength; and
   coupling means for interconnecting said detector circuit and said amplifying means, said coupling means including: first actuable filter means for attenuating frequency components above a predetermined range in said detector circuit output, said first actuable filter means being actuated by said control signal; and second actuable filter means for attenuating frequency components below said predetermined range in said detector circuit output, said second actuable filter means being actuated by said control signal and being connected in cascade with said first actuable filter means.

2. The combination of claim 1 wherein said circuit means is included in an automatic gain control circuit connected to receive the output of said detector circuit; and wherein said first actuable filter means comprises a resistor connected in series between said detector circuit and said amplifying means; a first capacitor adapted to be connected in shunt relationship with said resistor; and first switch means responsive to said control signal for electrically connecting said first capacitor to said resistor when said received signal strength is relatively low and for electrically disconnecting said first capacitor from said resistor when said received signal strength is relatively high.

3. The combination of claim 2 wherein said second actuable filter means comprises a second capacitor connected in series with said resistor; and second switch means responsive to said control signal for short circuiting said second capacitor when said received signal strength is relatively low.

4. The combination of claim 3 wherein said first switch means comprises a first transistor having its collector-emitter circuit connected in series with said first capacitor.

5. The combination of claim 4 wherein said second switch means comprises a field effect transistor having its source-drain circuit connected in parallel with said second capacitor and its gate electrode coupled to the output of a second transistor.

6. The combination of claim 3 wherein said information is audio information and said amplifying means comprises an audio amplifier; and a gain control circuit coupled to said circuit means and responsive to said control signal for varying the gain of said audio amplifier inversely with respect to said received signal strength.

* * * * *